United States Patent [19]
Goodman

[11] Patent Number: 5,607,725
[45] Date of Patent: Mar. 4, 1997

[54] CVD METHOD FOR COATING A GLASS SUBSTRATE

[75] Inventor: Ronald D. Goodman, Toledo, Ohio

[73] Assignee: Libbey-Owens-Ford Co., Toledo, Ohio

[21] Appl. No.: 396,868

[22] Filed: Mar. 1, 1995

Related U.S. Application Data

[63] Continuation of Ser. No. 48,797, Apr. 16, 1993, abandoned.

[51] Int. Cl.$^6$ ............................ C23C 16/00; C03C 17/00
[52] U.S. Cl. ................................ 427/255.5; 427/255.2; 427/255.1; 427/166; 427/109; 427/9; 427/10; 65/60.5
[58] Field of Search ........................... 427/166, 109, 427/255.5, 255.1, 255.2, 251, 9, 10; 65/60.5

[56] References Cited

U.S. PATENT DOCUMENTS

| | | | |
|---|---|---|---|
| 4,676,992 | 6/1987 | Letellier | 427/9 |
| 4,732,776 | 3/1988 | Boissevain | 427/10 |
| 5,009,485 | 4/1991 | Hall | 427/9 |
| 5,217,753 | 6/1993 | Goodman et al. | 427/166 |

Primary Examiner—Roy V. King
Attorney, Agent, or Firm—Marshall & Melhorn

[57] ABSTRACT

A method for applying a coating to a substrate comprises a gas distributor having an outlet disposed adjacent to the substrate for directing a gaseous reactant mixture to the surface of the substrate. A plurality of drop tubes are provided which communicate with and are spaced along the length of the distributor for supplying the gaseous reactant mixture to the distributor. The uniformity of the thickness of the coating which is applied to the substrate along its width is determined. Finally, one or more of the reactants or an inert gas is supplied to one or more of the drop tubes to alter the concentration of one or more of the reactants in the gaseous reactant mixture flowing through one or more drop tubes. The rate of deposition of the coating in the proximity of such drop tubes is thereby altered to improve the uniformity of the coating deposited.

17 Claims, 2 Drawing Sheets

CVD METHOD FOR COATING A GLASS SUBSTRATE

This application is a continuation of application Ser. No. 08/048,797, filed Apr. 16, 1993, now abandoned.

BACKGROUND OF THE INVENTION

1. Field of the Invention

The present invention relates to a method and apparatus for coating a substrate, particularly a glass substrate. More particularly, the invention relates to a continuous chemical vapor deposition (CVD) process for producing coated glass for vehicles or architectural windows, and the apparatus for producing such coated glass.

2. Summary of Related Art

Chemical vapor deposition processes are well known in the art of coating substrates. The substrate is coated by directing a flow of a gaseous reactant mixture toward the surface of the substrate to cause the reactant mixture to deposit the desired coating on the substrate surface. The physical form of the coating reactants employed in such processes may be liquid, vapor, liquids or solids dispersed in gas mixtures, aerosols, or vaporized or vaporous coating reactants dispersed in gas mixtures.

One of the problems associated with CVD processes relates to the production of a coating of uniform thickness along the width of the substrate. In certain instances, such as the application of a reflective metal oxide coating to a sheet of glass, the requirement that the coating have a uniform thickness is especially important, since small variations in the coating thickness can result in the glass sheet having non-uniform color. For example, variations in thickness of the metal oxide coating of one millionth of an inch can produce an unaesthetic appearance in the glass.

Generally, in order to produce a coating having a constant thickness, it is necessary that the gaseous reactant mixture be uniformly applied to the entire sheet of glass. Various means have been proposed for applying the gaseous reactant mixture in a uniform manner to a sheet of glass. For example, U.S. Pat. No. 4,504,526 discloses an apparatus which comprises a plurality of serially arranged, individual passageways interconnecting an inlet and an outlet positioned adjacent the glass sheet. Each of the individual passageways includes a portion having a cross sectional area different from the cross sectional area of adjacent passageways, causing the velocity of the fluid flowing through the passageways to vary.

In U.S. Pat. No. 4,535,000, Gordon describes a chemical vapor deposition process for applying a thin metal nitride film on a glass substrate. Gordon suggests the use of multiple coaters as a means of obtaining a uniform coating, since the non-uniformities of one coater will not usually match those of the other coaters, and there will tend to be some cancellation of thickness errors from the different coaters.

As taught by Sopko et al. in U.S. Pat. No. 3,580,679, a gaseous mixture is distributed along the substrate by a vapor manifold comprised of a plurality of vapor channels separated from one another at their exit ends, but which meet in a common channel at their entrance. To enhance the uniformity of vapor deposition, it is suggested that each channel include at least two opposing curves so that the vapors passing through the channel change direction at least twice. In addition, Sopko notes that baffles may be positioned within the channels to further interrupt the vapor flow and distribute the vapor along the length of the vapor manifold.

Despite the various means previously proposed, some examples of which are noted above, problems still arise with regard to the application of a coating of uniform thickness on a substrate by a chemical vapor deposition process. The causes of such non-uniformity are uncertain, but may include problems of exhaust balancing, temperature gradients in the substrate to be coated, dimensional changes in the coater upon heating, changes in the entrance region Reynolds number with changes in total flow, and the build up of deposits in the coater. Whatever the cause, it would be advantageous to provide a method and apparatus for substantially eliminating any lack of uniformity in the thickness of a coating applied to a substrate in a chemical vapor deposition process.

SUMMARY OF THE INVENTION

The present invention relates to an apparatus for applying a coating to a substrate by a chemical vapor deposition process. The apparatus comprises a gas distributor having an outlet disposed adjacent to the substrate to be coated for directing a gaseous reactant mixture to the surface of the substrate. The gaseous reactant mixture is comprised of one or more reactants and an inert carrier gas. A plurality of drop tubes are provided which communicate with and are spaced along the length of the distributor for supplying the gaseous reactant mixture to the distributor. The apparatus includes means for determining the uniformity of the thickness of the coating which is applied to the substrate along its width. Finally, there is a means for supplying one or more of the reactants or an inert gas to one or more of the drop tubes to alter the concentration of one or more of the reactants in the gaseous reactant mixture flowing through that drop tube. The rate of deposition of the coating in the proximity of such drop tube is thereby altered to improve the uniformity of the thickness of the coating deposited.

The invention also relates to a method of applying a coating of substantially uniform thickness to a surface of a substrate. According to the method of the present invention, a gaseous reactant mixture, comprised of one or more reactants and an inert carrier gas, is supplied to a gas distributor by means of a plurality of drop tubes in communication with and spaced along the length of the distributor. A coating is formed on the substrate by directing the gaseous reactant mixture to the surface of the substrate from an outlet formed in the distributor adjacent the surface of the substrate. The uniformity of the thickness of the coating applied to the substrate at various positions along the width of the substrate is then determined, and one or more of the reactants or an inert gas is supplied to one or more of the individual drop tubes to alter the concentration of one or more of the reactants in the gaseous reactant mixture flowing through such drop tube. The rate of deposition of the coating in the proximity of such drop tube is thus altered to improve the uniformity of the thickness of the coating deposited. In addition, introduction of a sufficient amount of an inert gas to a drop tube will cause a static pressure increase in that drop tube, increasing the total flow of the gaseous reactant mixture to the remaining drop tubes.

The present invention thereby provides for a relatively simple and inexpensive means of correcting variations in coating thickness obtained in a CVD process. Further, a more uniform coating may be obtained regardless of the cause of the original lack of uniformity.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

The method and apparatus of the present invention may be employed in combination with a variety of substrates and coatings, and may be used to coat a continuous sheet or a series of discrete substrates. In the preferred embodiments of the invention, a continuous glass sheet is coated. This may be a sheet produced by the plate process, by any sheet process, or by a float process. The description which follows relates to the coating of a newly formed float glass ribbon.

Furthermore, the method and apparatus of the present invention are applicable to the chemical vapor deposition of any one or more reactants. In a preferred embodiment, the method and apparatus of the present invention are used to deposit a titanium nitride film on a newly formed float glass ribbon. A mixture of a titanium tetrahalide and a reducing agent, preferably titanium tetrachloride and anhydrous ammonia, is reacted at or near the surface of the glass sheet upon which the titanium nitride coating is to be deposited. Both reactants are preferably supplied in helium as an inert carrier gas. This method for preparing a titanium nitride coating is more fully set forth in U.S. Pat. Nos. 4,545,000 and 5,087,525, both of which are incorporated herein in their entirety by reference thereto.

Figure 1:
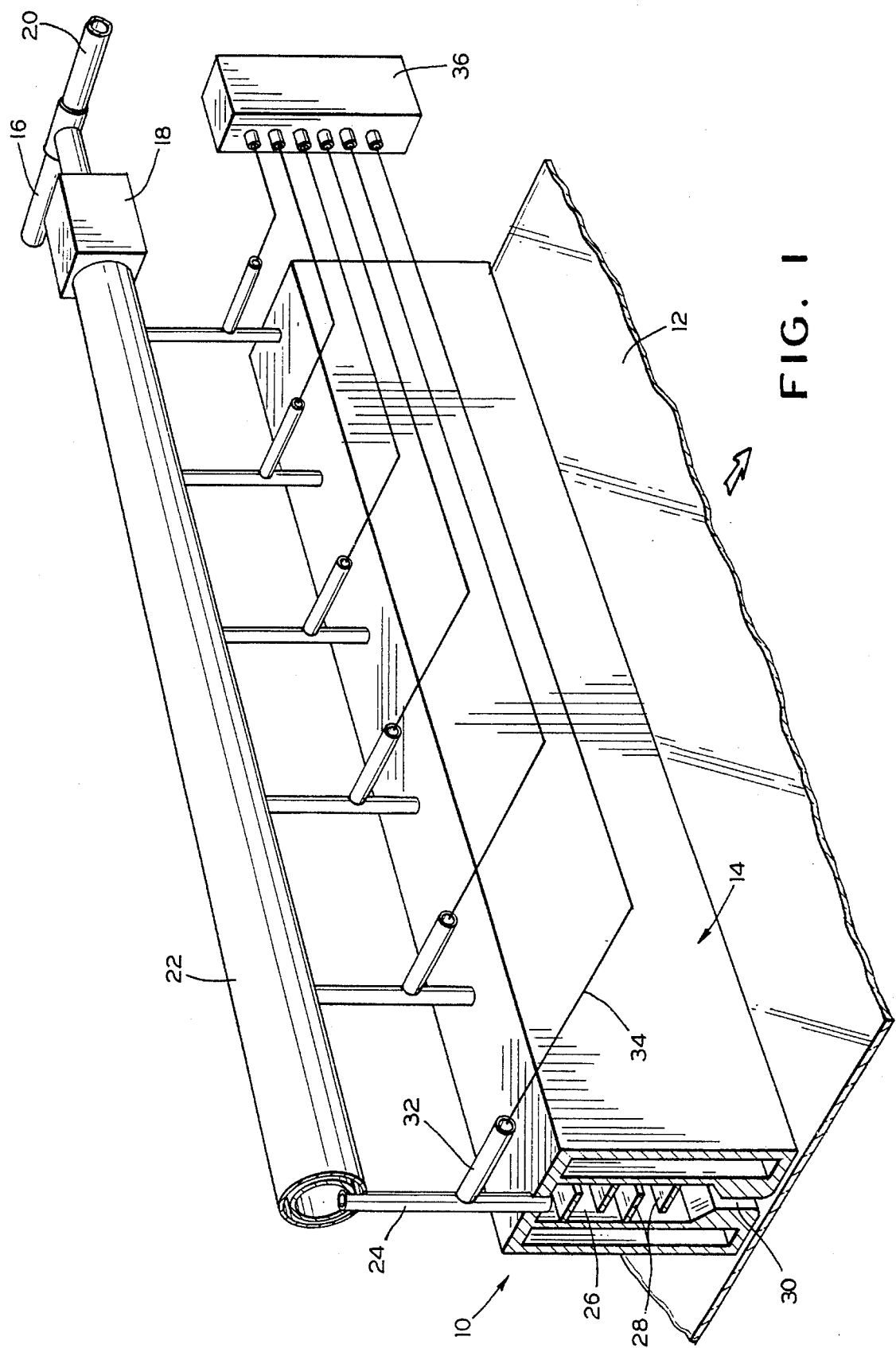
FIG. 1 is a somewhat schematic, partial cutaway perspective view of the coating apparatus of the present invention.

Referring now to FIG. 1, there is illustrated an apparatus, generally designated 10, for applying a coating to a substrate, such as a continuous glass ribbon or sheet 12. The glass sheet 12 is generally supported on rollers (not shown) which move the glass sheet 12 along a path such as is indicated by the arrow at the lower right of the Figure. The process entails forming a glass substrate, generally in a float glass process, and continuously advancing the glass sheet 12, while hot, past the coating apparatus 10 illustrated in the Figure. The coating apparatus is generally positioned in a sealed zone in which a non-oxidizing atmosphere is maintained. The non-oxidizing atmosphere is generally a gas comprising about 99% by volume nitrogen and 1% by volume hydrogen. However, other inert gases can be substituted for the nitrogen, or the proportion of hydrogen can be increased or decreased, so long as the desired result is achieved; i.e., oxidation of the tin bath is prevented.

The coating apparatus 10 more particularly comprises a vapor distributor 14 disposed in facing relation to the glass sheet 12 and spanning the width of the glass sheet 12. A mixture of vaporized reactants is supplied to the vapor distributor 14 by means of a supply assembly described in detail below. A first vaporized reactant, generally mixed with an inert carrier gas such as nitrogen or helium, is supplied through the supply line 16 to a mixing device 18. Within the mixer 18, the first vaporized reactant is mixed with a second vaporized reactant supplied to the mixer 18 via the supply line 20. The second vaporized reactant is also generally mixed with an inert carrier gas before being introduced to the mixer 18. It is generally preferred that the same carrier gas be used for both of the reactants.

The vapor mixture, comprised of a mixture of the first and second reactants and the carrier gas or gases, passes from the mixer 18 to a jacketed header 22. The jacketed header 22 may be used in the conventional manner to maintain the temperature of the vapor mixture in the desired range for the specific coating conditions of any particular application. The vapor mixture is supplied to the vapor distributor 14 from the header 22 by means of a series of drop tubes 24 providing communication therebetween. The drop tubes 24 are generally spaced approximately evenly along the lengths of the header 22 and distributor 14.

From the drop tubes 24, the vapor mixture flows into a channel 26 formed in the distributor 14. The channel 26 may advantageously be provided with a number of baffles 28, which force the vapor mixture through a number of direction changes, more evenly distributing the vapor mixture along the length of the distributor 14. This improves the uniformity of the coating deposited on the glass sheet 12. The vapor mixture flows by the baffles 28 and out of the distributor 14 through the outlet 30, which is disposed adjacent the glass sheet 12. The first and second reactants in the vapor mixture react at or near the surface of the glass sheet 12, continuously depositing the desired coating on the glass sheet 12 as it passes by the distributor 14.

Despite the series of spaced drop tubes 24 which supply the vapor mixture to the distributor 14, and the series of baffles 28 provided therein, oftentimes the thickness of the coating deposited on the glass sheet 12 is not uniform across the width of the glass sheet 12. As mentioned above, this may be due to a number of factors, such as problems of exhaust balancing, temperature gradients in the substrate to be coated, dimensional changes in the coater upon heating, changes in the entrance region Reynolds number with changes in total flow, and the build up of deposits in the coater. When a reflective coating is being deposited on the glass sheet 12, this non-uniformity may result in an unacceptable variation in transmission and reflected color across the width of the glass sheet 12.

To remedy any detected non-uniformity in coating thickness, a plurality of the drop tubes 24 of the coating apparatus 10 are provided with a coupling or side arm 32. In a preferred embodiment, all of the drop tubes 24 are provided with a side arm 32. Each of the side arms 32 communicates via a separate supply line 34 with a flow control means 36. The flow control means 36 may be connected to a supply of one or more of the reactants. Alternatively, the flow control means 36 may be connected to a supply of an inert gas, preferably the same inert gas used as the carrier gas for the reactants. In a preferred embodiment, the flow control means 36 is connected both to a supply of one or more of the reactants and a supply of an inert gas. The flow control means 36 controls the flow of one or more of the reactants or an inert gas (or both) to any one or more of the side arms 32 through the individual supply lines 34 (shown schematically). The flow control means 36 may be any suitable device for controlling such flow, such as the Sierra mass flow controller available commercially from Sierra Instruments, Inc. of Monterey, Calif.

If it is determined that the coating being deposited on the glass sheet 12 is too thin in a particular area, the flow control means 36 is activated to supply one or more of the reactants to one or more of the drop tubes 24, via the associated supply line 34 and side arm 32, which are positioned in that particular area. Since the reaction rate of film formation on the glass sheet 12 is dependent on the concentration of the reactants in the gas phase above the glass sheet 12, the resulting increase in the concentration of one of the reactants will increase the rate of deposition and the thickness of the coating deposited in that particular area. In this manner, a more uniform coating thickness, color, and transmittance may be achieved across the width of the glass sheet 12.

On the other hand, if it is determined that the coating being deposited on the glass sheet 12 is too thick in a particular area, the flow control means 36 is activated to supply an inert gas to one or more of the drop tubes 24, via the associated supply line 34 and side arm 32, which are positioned in that particular area. The introduction of an inert gas into a particular drop tube 24 reduces the concentration of the reactants in the vapor mixture passing through that drop tube 24, thereby reducing the deposition rate on the glass sheet 12 in the area of the particular drop tube 24. In addition, the introduction of additional inert gas into a drop tube 24, if of sufficient volume, produces some static pressure increase in the drop tube 24 in which it is introduced. This decreases the total flow of the vapor mixture to that drop tube 24, and causes an increase in total flow of the vapor mixture to the surrounding drop tubes 24. This again results in the deposition of a thinner coating proximate the drop tube 24 in which the inert gas is introduced.

Figure 2:
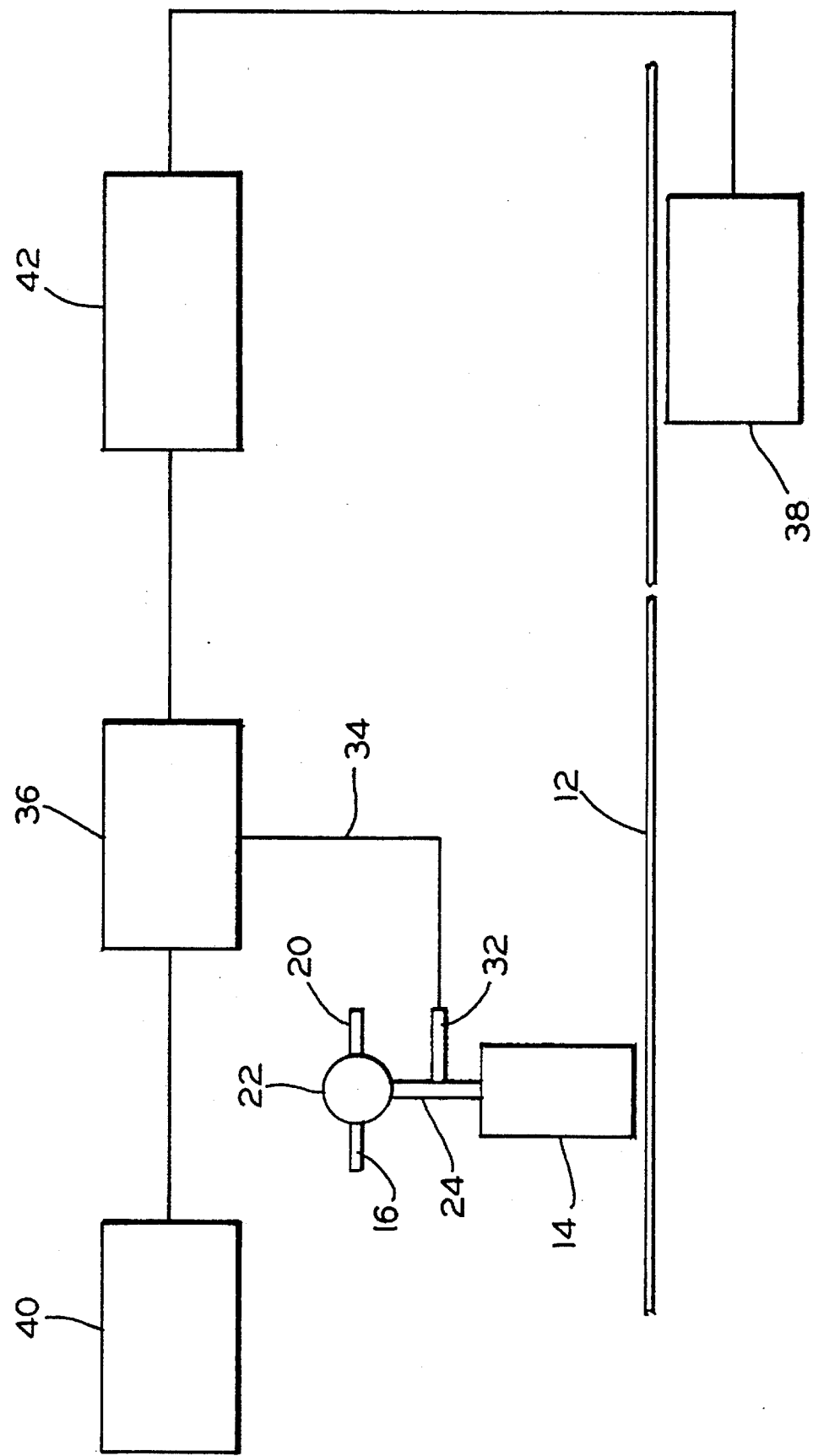
FIG. 2 is a schematic representation of the apparatus of the invention.

FIG. 2 illustrates schematically the method of the present invention. The vaporized reactants are supplied through the supply lines 16 and 20 to the jacketed header 22, down through the drop tubes 24 to the distributor 14. The vapor mixture flows out of the distributor 14 through an outlet disposed adjacent the glass sheet 12. The first and second reactants in the vapor mixture react at or near the surface of the glass sheet 12, continuously depositing the desired coating on the glass sheet 12 as it passes by the distributor 14.

As will be appreciated, a thickness measuring means 38 for measuring the thickness of the coating deposited on the glass sheet 12 is required. Where a reflective coating is deposited, the thickness may preferably be measured by means of a photometer 38 positioned downstream of the coating apparatus 10. A thinner reflective coating results in a higher transmittance and a change in reflected color, and this can be measured by the photometer. In the case of the deposition of a titanium nitride coating on a glass sheet, a thinner coating results in a more negative value for the b* component of reflected color, where b* measures the amount of yellow-blue color in the color scale system established by the Commission International de l'Eclairage (hereinafter "CIE-lab"). Thus, the uniformity of the thickness of the coating may be determined indirectly by measuring the b* component across the width of the glass sheet 12. In a preferred embodiment, an online scanning photometer is employed to determine the thickness of the coating deposited along the width of the glass sheet 12.

Manual control means 40 may be utilized to activate the flow control means 36 manually in response to visual output provided by whatever suitable means 38 is employed to determine the thickness of the deposited coating. In an alternate, preferred embodiment, the thickness measuring means 38 is connected to a programmable controller 42 which is connected to and automatically activates the flow control means 36 in response to receiving a signal from the thickness measuring means 38. When this signal indicates a non-uniformity of the coating thickness outside of a predetermined acceptable range programmed in controller 42, the flow control means 36 is activated by the controller 42 to supply one or more of the reactants or an inert gas to one or more of the individual drop tubes 24 to alter the concentration of one or more of the reactants in the gaseous reactant mixture flowing through such drop tube 24. The rate of deposition of the coating in the proximity of such drop tube is thereby altered to obtain a coating on the substrate having improved uniformity of thickness.

In this application and accompanying drawings there is shown and described a preferred embodiment of the invention and suggested various alternatives and modifications thereof, but it is to be understood that these are not intended to be exhaustive and that other changes and modifications can be made within the scope of the invention. The suggestions contained herein are selected and included for purposes of illustration in order that others skilled in the art will more fully understand the invention and the principles thereof, and will be able to modify it and embody it in a variety of forms, each as may be best suited in the condition of a particular case. For example, it will be understood that any number of drop tubes and associated side arms greater than one may be utilized in accordance with the invention, depending upon the particular application.

What is claimed is:

1. A method of applying a coating to a surface of a moving ribbon of hot glass comprising:

(a) providing a coating gas distributor having a length extending across the width of the ribbon to be coated;

(b) supplying a gaseous coating mixture comprising at least one gaseous reactant from a supply header to said distributor at two or more supply locations spaced along the length of the distributor;

(c) directing the gaseous coating mixture from the distributor over the surface of the moving ribbon of hot glass to form a coating on the hot glass surface;

(d) measuring at least one optical property of the coated product at spaced locations across the coated width, said optical property being one which varies with a variation of the thickness of said coating; and (e) selectively varying the concentration of said at least one gaseous reactant in the gaseous coating mixture supplied at one or more of said spaced supply locations relative to the concentration of said at least one gaseous reactant supplied at one or more of the other of said spaced supply locations in response to a detected lack of uniformity of the coating as determined by said measured optical property to improve said uniformity of thickness of said coating.

2. A method as claimed in claim 1, wherein said gaseous coating mixture consists of one or more gaseous reactants and an inert carrier gas.

3. A method as claimed in claim 1, wherein the concentration of said at least one gaseous reactant is selectively varied by adding additional reactant or inert gas to the gaseous reactant mixture supplied at one or more of said spaced supply locations.

4. A method as claimed in claim 1, wherein the gaseous coating mixture is supplied to the gas distributor by means of a plurality of drop tubes providing fluid communication between said header and said gas distributor, said drop tubes being spaced along the length of the distributor, and wherein one or more reactants or an inert gas is supplied to a selected one or more of the individual drop tubes intermediate said header and said distributor in response to said detected lack of uniformity to alter the concentration of one or more reactants in the gaseous reactant mixture flowing through said one or more selected drop tubes relative to the concentration of said one or more gaseous reactants supplied at one or more of the other of said drop tubes, thereby altering the rate of deposition of the coating in the proximity of said selected one or more drop tubes.

5. A method as claimed in claim 4, wherein the thickness of the coating is determined indirectly by measuring reflected color.

6. A method as claimed in claim 5, wherein the thickness of the coating is determined indirectly by measuring glass side reflected color.

7. A method as claimed in claim 6, wherein the thickness of the coating is determined indirectly by measuring the b* component of the glass side reflected color.

8. A method as claimed in claim 1, wherein the thickness of the coating applied to the ribbon of hot glass is determined indirectly by measuring transmittance of the coating ribbon.

9. A method as claimed in claim 5, wherein the reflected color is measured using a photometer.

10. A method as claimed in claim 9, wherein the reflected color is measured using an online scanning photometer.

11. A method as claimed in claim 1, wherein one or more gaseous reactants or an inert gas is supplied to one or more of the spaced supply locations by means of a mass flow controller.

12. A method as claimed in claim 4, wherein said one or more reactants or an inert gas is supplied to one or more of said drop tubes by means of a mass flow controller.

13. A method as claimed in claim 12, wherein one or more gaseous reactants is supplied to one or more of said drop tubes proximate an area where the thickness of the coating deposited was observed to be small relative to the thickness of the coating observed in other areas.

14. A method as defined in claim 12, wherein said inert gas is supplied to one or more of said drop tubes proximate an area where the thickness of the coating deposited was observed to be large relative to the thickness of the coating observed in other areas.

15. A method as claimed in claim 4, wherein a gaseous mixture comprised of a titanium tetrahalide, a reducing agent, and an inert carrier gas is supplied to said gas distributor by means of said drop tubes.

16. A method as claimed in claim 4, wherein a gaseous mixture comprised of titanium tetrachloride and ammonia in helium as an inert carrier gas is supplied to said gas distributor by means of said drop tubes.

17. A method as claimed in claim 1, wherein the selective variation is controlled by a programmable controller connected to measuring means arranged to measure said optical property.

* * * * *